(12) United States Patent
Lutz et al.

(10) Patent No.: US 7,847,230 B2
(45) Date of Patent: Dec. 7, 2010

(54) RADIATION DETECTOR FOR DETECTING LOW-INTENSITY RADIATION BY MEANS OF AVALANCHE AMPLIFICATION

(75) Inventors: Gerhard Lutz, Munich (DE); Lothar Strueder, Munich (DE); Peter Holl, Munich (DE)

(73) Assignee: Max-Planck-Gesellschaft zur Foerderung der Wissenschaften E.V., Munich (DE)

( * ) Notice: Subject to any disclaimer, the term of this patent is extended or adjusted under 35 U.S.C. 154(b) by 18 days.

(21) Appl. No.: 11/916,075

(22) PCT Filed: May 17, 2006

(86) PCT No.: PCT/EP2006/004687

§ 371 (c)(1),
(2), (4) Date: Nov. 30, 2007

(87) PCT Pub. No.: WO2006/128588

PCT Pub. Date: Dec. 7, 2006

(65) Prior Publication Data

US 2008/0191123 A1    Aug. 14, 2008

(30) Foreign Application Priority Data

Jun. 3, 2005    (DE) .................. 10 2005 025 641

(51) Int. Cl.
*H01L 27/00* (2006.01)
*H03F 3/08* (2006.01)
*H04N 3/14* (2006.01)
*H01L 31/107* (2006.01)

(52) U.S. Cl. ................. 250/208.1; 250/214 A; 348/311; 257/438

(58) Field of Classification Search ............ 250/208.1, 250/214 A, 214 LA, 214.1, 214 R; 348/300, 348/301, 302, 308, 311; 257/257, 258, 290, 257/291, 431, 438

See application file for complete search history.

(56) References Cited

U.S. PATENT DOCUMENTS 4,672,207 A * 6/1987 Derenzo ............. 250/363.02
(Continued)

FOREIGN PATENT DOCUMENTS

DE    102004022948 A1    12/2005
(Continued)

OTHER PUBLICATIONS

Holland, "New developments in CCD and pixel arrays", Nuclear Instruments and Methods in Physics Research A 513 (2003), pp. 308-312.

(Continued)

*Primary Examiner*—Georgia Y Epps
*Assistant Examiner*—Don Williams
(74) *Attorney, Agent, or Firm*—Caesar, Rivise, Bernstein, Cohen & Pokotilow, Ltd.

(57) ABSTRACT

The invention relates to a radiation detector (1) for detecting low-intensity radiation, especially for detecting individual photons. The radiation detector includes a plurality of rows of image cells (5) with respective pluralities of image cells (5) disposed one after the other and respective signal outputs (6). The radiation to be detected generates signal charge carriers in the individual image cells (5), the charge carriers being transported along the rows of image cells to the respective signal output (6). A plurality of output amplifiers (7) are connected in parallel to one of the signal outputs each of the individual image cell columns and amplify the signal charge carriers. The invention is characterized in that the output amplifiers (7) include respective avalanche amplifiers (8).

30 Claims, 5 Drawing Sheets

U.S. PATENT DOCUMENTS

| | | | |
|---|---|---|---|
| 5,291,294 A | | 3/1994 | Hirota |
| 6,344,666 B1 * | | 2/2002 | Yamaguchi et al. ............ 257/98 |
| 7,277,130 B2 * | | 10/2007 | Korthout et al. ............ 348/308 |
| 2003/0042400 A1 | | 3/2003 | Hynecek |
| 2004/0022538 A1 * | | 2/2004 | Shushakov et al. ............ 398/51 |
| 2005/0083567 A1 | | 4/2005 | Liu et al. |
| 2005/0258449 A1 | | 11/2005 | Lutz et al. |

FOREIGN PATENT DOCUMENTS

| | | | |
|---|---|---|---|
| EP | 0866501 | A1 | 9/1998 |
| EP | 1152469 | A2 | 11/2001 |
| EP | 1596439 | A2 | 11/2005 |
| WO | 0237139 | A1 | 5/2002 |

OTHER PUBLICATIONS

Hynecek, "CCM—A New Low-Noise Charge Carrier Multiplier Suitable for Detection of Charge in Small Pixel CCP Image Sensors", IEEE Transactions on Electron Devices, vol. 39, No. 8 (1992), pp. 1972-1975.

Jerram et al., "The LLLCCD: Low Light Imaging without the need for an intensifier", Proc. SPIE, vol. 4306 (2001), pp. 1-9.

Lutz et al., "The Avalanche Drift Diode: A New Detector Concept for Single Photon Detection", IEEE (2004), pp. 21-24.

Lutz, "Semiconductor Radiation Detectors",(Springer Verlag, 2001), pp. 137-152; 165-175; 207-210; 233-238 and 243-253.

International Search Report for PCT/EP2006/004687.

* cited by examiner

RADIATION DETECTOR FOR DETECTING LOW-INTENSITY RADIATION BY MEANS OF AVALANCHE AMPLIFICATION

BACKGROUND OF THE INVENTION

The invention relates to a radiation detector for detecting low-intensity radiation, in particular for detecting individual photons, and an associated operating method.

The published document Gerhard LUTZ: "Semiconductor radiation detectors", Springer Verlag, $2^{nd}$ edition 2001, page 137-152 describes CCD detectors (Charge Coupled Devices) which are used for radiation detection. These known CCD detectors comprise a plurality of parallel image cell rows, each having a plurality of image cells arranged one behind another, in which the radiation to be detected generates signal electrons. These signal electrons are initially held in potential wells which are generated in the region of the individual image cells by an electrode arrangement. By means of suitable electrical control of the electrode arrangement, the signal electrons are further transported along the image cell rows from image cell to image cell and pass within the individual image cell rows to a signal output to which an output amplifier is connected, which amplifies the output signal, so that even low-intensity radiation can be detected. In the case of the known CCD detectors, the output amplifier comprises, for example, a simple transistor which is integrated, together with the CCD detector onto a semiconductor substrate.

However, a disadvantage of the aforementioned known CCD detectors is the unsatisfactory sensitivity, which is insufficient for detecting individual photons with energies of less than 30 eV.

From A. D. HOLLAND: "New developments in CCD and pixel arrays", Nuclear Instruments and Methods in Physics Research A. vol. 513 (2003), 308-312 and from the publication mentioned there, JERRAM et al.: "The LLLCCD: Low Light Imaging Without the Need for an Intensifier", Proceedings of SPIE, vol. 4306 (2001), 178-186, a CCD structure with an avalanche amplifier as the output amplifier is known. However, in this prior art, the individual image cell rows of the CCD structure open into a common shift register which shifts the signal electrons serially into a further shift register in which multi-step avalanche amplification takes place.

However, these known detector structures with multi-step serial avalanche amplification have a variety of disadvantages. The serial readout of the signal electrons, for example, leads to a lower read-out speed and to a correspondingly low image refresh rate. Furthermore, the avalanche amplification takes place in multiple steps, which leads to a high level of non-linearity.

Furthermore, from HYNECEK, J.: "CCM—a new low-noise charge carrier multiplier suitable for detection of charge in small pixel CCD image sensors", IEEE Transactions on Electron Devices, vol. 39, No. 8 (1992), 1972-1975, a CCD detector structure is known wherein avalanche amplification of the signal electrons takes place. However, avalanche amplification takes place within the CCD detector structure and not in a separate output amplifier.

Furthermore, US2005/0083567A1 and WO02/37139A1 describe detector arrangements, although these are less relevant.

It is an object of the invention, in the above described known CCD detector, to improve the sensitivity.

This aim is achieved with a radiation detector according to the invention and a corresponding operating method according to the invention.

SUMMARY OF THE INVENTION

The invention covers the general technical teaching of using a plurality of parallel avalanche amplifiers to amplify the output signals of the individual image cell rows of the CCD structure.

The use of an avalanche amplifier offers the advantage that the signal charge carriers read out from the individual image cell rows can also be amplified, even when individual photons are being detected, far beyond the noise of the read-out electronics.

In contrast to the known radiation detectors, the radiation detector according to the invention also enables the detection of individual photons with energies of less than 30 eV. However, the invention is not restricted to radiation detectors that have such a high level of sensitivity. Rather, the invention also includes radiation detectors with a lower sensitivity which, for example, can only detect single photons with an energy of greater than 30 eV.

The parallel arrangement of the individual avalanche amplifiers at the signal outputs of the individual image cell rows offers the advantage that a high image refresh rate is possible. For example, the radiation detector according to the invention may have an image refresh rate of at least 100, 500 or 1000 frames per second.

Preferably, the individual avalanche amplifiers each have a single avalanche region (high-field region) in which the avalanche amplification takes place. With the invention, the avalanche amplification therefore preferably takes place in a single step and not in multiple steps, as in the aforementioned publications by HOLLAND and JERRAM.

Furthermore, the avalanche region in the invention is preferably spatially separated from the image cells, whereas the avalanche amplification in the aforementioned known publication by HYNECEK takes place within the detector structure.

In a preferred exemplary embodiment of the invention, the radiation detector has a CCD detector structure for detecting the radiation, as described by Gerhard LUTZ: "Semiconductor radiation detectors", Springer Verlag, $2^{nd}$ edition 2001, pages 137-152, so that the content of this publication regarding the structure and operational method of the CCD detector structure is to be added in its entirety to the present description. For example, the CCD detector structure may be a pn-CCD detector structure or a MOS-CCD detector structure, as described in the aforementioned publications. The combination of the avalanche amplifier according to the invention with a pn-CCD detector structure is particularly advantageous, however, since the signal charge carriers are stored in a pn-CCD detector structure at a depth in the range of approximately 2 μm to 15 μm and are further transported along the image cell rows, so that the signal charge carriers can then be accelerated in a vertically arranged avalanche amplifier to the surface of the semiconductor structure to a read-out electrode situated there.

However, with regard to the image cells serving for radiation detection, the invention is not restricted to a CCD detector structure, but is essentially also able to be realized with other types of image cells that generate signal charge carriers.

It should also be mentioned that signal electrons are preferably used in the individual image cells as signal charge carriers. However, it is fundamentally also possible that holes which are transported along the image cell rows to the signal output are used in the individual image cells as signal charge carriers.

Preferably, in the radiation detector according to the invention, the image cells and the avalanche amplifier are integrated together in a semiconductor substrate. By this means, capacitance-laden connection lines between the signal outputs of the individual image cell rows and the associated output amplifiers can be largely dispensed with.

In a preferred embodiment of the invention, the individual avalanche amplifiers each have an avalanche region with an electric avalanche field that is angled relative to the surface of the semiconductor substrate. In this embodiment, the signal charge carriers are therefore not accelerated parallel to the surface of the semiconductor substrate, but at a particular angle to the surface.

Preferably, the avalanche field is herein oriented substantially perpendicularly to the surface of the semiconductor substrate. This is advantageous in particular if, for radiation detection, a pn-CCD detector structure is used in which the signal charge carriers are stored and further transported at a depth of approximately 2-15 μm, since the signal charge carriers can then be accelerated in the avalanche region of the avalanche amplifier perpendicularly to a read-out electrode situated at the surface of the semiconductor substrate. The acceleration of the signal charge carriers therefore preferably takes place in the direction of the surface of the semiconductor substrate.

However, it is also fundamentally possible within the scope of the invention that the signal charge carriers are accelerated in the avalanche region away from the surface of the semiconductor substrate into the semiconductor substrate. In such a case, the signal charge carriers must then be transported back again from the depth of the semiconductor substrate to a read-out electrode arranged on the surface of the semiconductor substrate, which is fundamentally possible.

It should also be mentioned that, in addition to the avalanche amplifiers, the individual output amplifiers preferably each have a transistor amplifier, wherein the avalanche amplifiers are preferably connected upstream before the transistor amplifiers. These transistor amplifiers may be conventional MOSFETs (MOSFET=Metal Oxide Semiconductor Field Effect Transistor) or JFETs (JFET=Junction Field Effect Transistor). However, the invention is not restricted, with regard to the types of transistor amplifiers, to the aforementioned types of transistor amplifiers, but can fundamentally also be carried out with other amplifier types.

The combination of transistor amplifiers with avalanche amplifiers enables a relatively small amplification factor in the range of approximately 100 to 1000. This offers the advantage that, at such low amplification factors, there is only a small probability that the avalanche processes taking place in the avalanche amplifiers generate optical photons which are erroneously detected in adjoining image cells, which would result in crosstalk between adjoining image cells.

It is therefore preferably provided that the amplification factor of the individual avalanche amplifiers is so small that no crosstalk takes place between the adjoining avalanche amplifiers or between avalanche amplifiers and adjoining image cells. It should be considered herein that crosstalk of this type can never be completely prevented for statistical reasons, since the optical photons possibly generated in the avalanche amplifiers are always erroneously detected with a statistical probability. However, it can be assumed that practically no crosstalk takes place if the erroneous detection quota, that is, the ratio of correctly detected photons to erroneously detected photons is greater than $10^2$, $10^4$ or $10^6$. Preferably, the amplification factors of the individual avalanche amplifiers therefore amounts to a maximum of 500, 1000, 5000 or 10000.

In a preferred exemplary embodiment of the invention, it is further provided that the amplification factor of the output amplifiers, that is, of the transistor amplifiers and/or of the avalanche amplifiers, is adjustable. This offers the advantage that the amplification factor can be adjusted to the intensity of the radiation to be detected. Given a relatively high intensity of the radiation to be detected, the avalanche amplifiers can practically be switched off, so that they have an amplification factor of k=1. This switching off of the avalanche amplifiers when detecting radiation of high intensity is useful, since the amplification factor of the additional transistor amplifiers is then sufficient to generate an output signal that can be evaluated, whilst crosstalk from the individual avalanche amplifiers is then precluded. In the detection of low intensity radiation, the avalanche amplifiers can be switched on with an amplification factor of k>>1 in order that, in an extreme case, individual photons can also be detected.

It should also be mentioned that the output amplifiers, i.e. the transistor amplifiers and/or the avalanche amplifiers, preferably have a substantially linear amplification in order to avoid distortions in the image detection.

The radiation detector according to the invention also preferably has an adjustable image refresh rate, which advantageously enables adaptation to the intensity of the radiation to be detected. On detection of high intensity radiation, a relatively high image refresh rate can be set, since then relatively short integration periods are sufficient in the individual image cells in order to generate sufficient signal charge carriers. With a lower intensity of radiation to be detected, however, a lower image refresh rate is preferably set, leading to a longer integration time in the individual image cells, so that even given a lower photon flux, a sufficient number of signal charge carriers can be generated.

It should also be mentioned that the invention not only includes the aforementioned radiation detector according to the invention, but also a corresponding operating method, which is also contained in the above general description.

Within the context of the operating method according to the invention, the amplification factor of the avalanche amplifier is preferably set depending on operating conditions of the radiation detector, wherein, for example, the operating conditions may relate to the photon flux and/or the intensity of the radiation to be detected.

Furthermore, in the context of the operating method according to the invention, the image refresh rate is preferably also set depending on the operating conditions of the radiation detector, wherein these operating conditions include, for example, the photon flux and/or the intensity of the radiation to be detected.

The image refresh rate is preferably set according to a saw-tooth characteristic, depending on the photon flux. The saw-tooth characteristic preferably has two rising edges, wherein the avalanche amplifiers are switched off in one edge of the saw-tooth characteristic and have an amplification factor of k=1, whereas the avalanche amplifiers are switched on in the other rising edge of the saw-tooth characteristic and have an amplification factor of k>>1.

BRIEF DESCRIPTION OF SEVERAL VIEWS OF THE DRAWINGS

Other advantageous embodiments of the invention are characterized in the dependent claims or are described in greater detail below, together with the description of the preferred exemplary embodiments of the invention based on the drawings, in which:

DETAILED DESCRIPTION OF PREFERRED EMBODIMENTS

Figure 1:
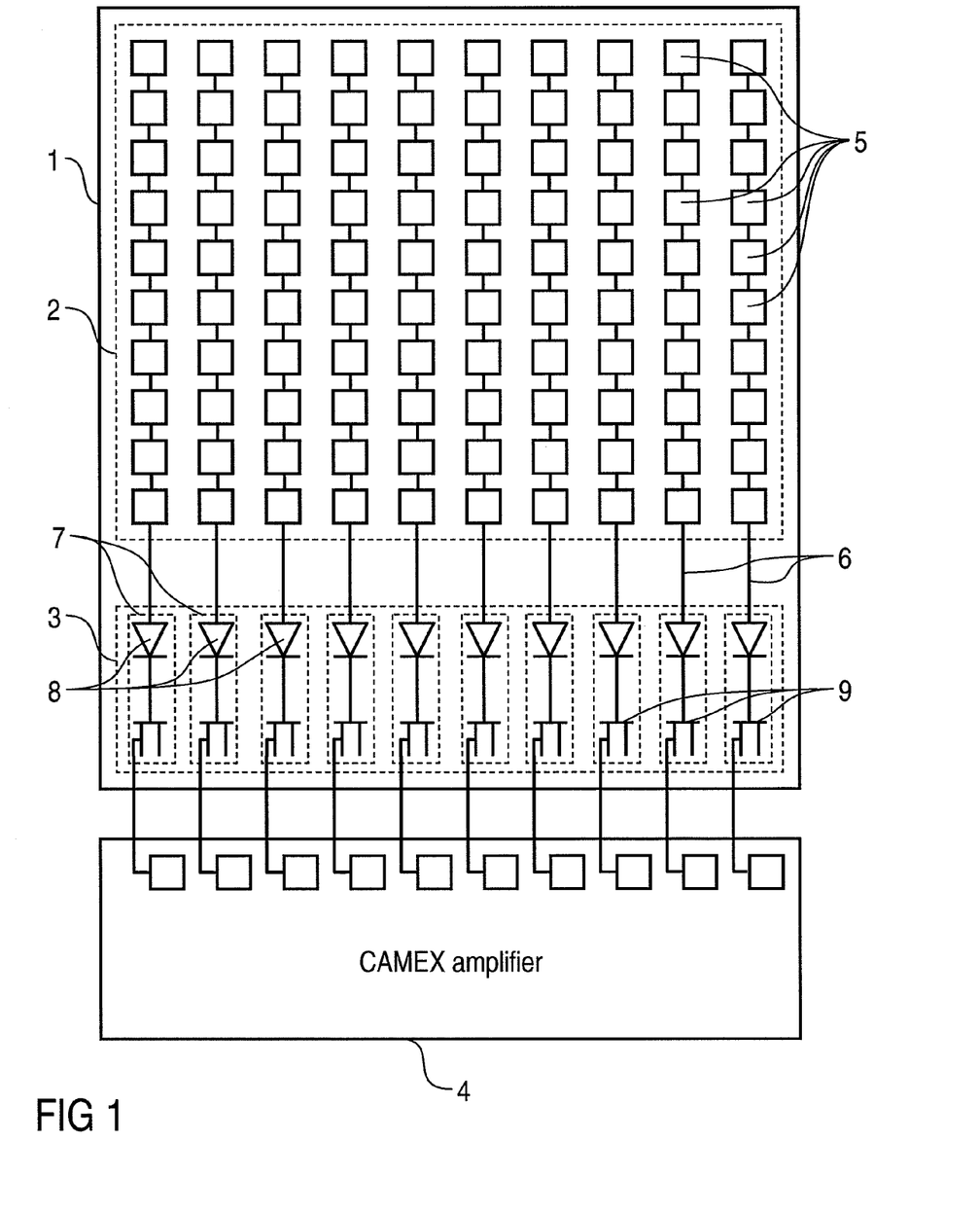
FIG. 1 shows a schematic circuit diagram of a radiation detector according to the invention with a matrix-shaped CCD detector structure and an output amplifier unit, wherein the radiation detector is connected to a conventional CAMEX amplifier.

FIG. 1 shows, in schematic form, a radiation detector 1 according to the invention with a conventional matrix-shaped CCD detector structure 2 and an output amplifier unit 3 wherein the output amplifier unit 3 is integrated together with the CCD detector structure 2 on a common semiconductor substrate.

On the output side, the radiation detector 1 is connected to a conventional CAMEX amplifier 4, as described, for example, in Gerhard LUTZ: "Semiconductor radiation detectors", Springer Verlag, $2^{nd}$ edition 2001, pages 207-210, so that with regard to the structure and operational method of the CAMEX amplifier 4, reference is made to the above publication which is to be added in its entirety to the present description regarding the CAMEX amplifier 4. In place of the CAMEX amplifier 4, however, a different amplifier type may also be used.

The CCD detector structure 2 is also conventionally constructed, as in Gerhard Lutz: "Semiconductor radiation detectors", Springer Verlag $2^{nd}$ edition 2001, pages 137-152. A detailed description of the construction and functionality of the CCD detector structure 2 can therefore be dispensed with in the following, since the content of the previously mentioned publication concerning the structure and the functional method of the CCD detector structure 2 is to be added in its entirety to the present description. It should merely be mentioned at this point that the CCD detector structure 2 has a plurality of image cell rows in each of which a plurality of image cells 5 are arranged one behind the other, wherein the radiation to be detected in the individual image cells 5 of the CCD detector structure 2 generates signal electrons which are each transported within the individual image cell rows to a signal output 6.

The output amplifier unit 3 of the radiation detector 1 has a plurality of parallel output amplifiers 7 which are connected in parallel to the individual signal outputs 6 of the individual image cell rows of the CCD detector structure 2. The parallel arrangement of the individual output amplifiers 7 offers the advantage that, due to the parallel readout a relatively high image refresh rate of more than 1000 images per second is possible.

The individual output amplifiers 7 each have an avalanche amplifier 8 and a transistor amplifier 9 connected downstream, wherein the avalanche amplifiers 8 and the transistor amplifiers 9 each have an adjustable amplification factor and enable detection of individual photons.

The amplification factor of the individual avalanche amplifiers 8 in the switched-on state lies in the range of 100 to 1000, wherein amplification factors in this range are small enough to prevent the optical photons which arise in the avalanche amplifiers 8 due to the avalanche amplification from causing crosstalk in adjoining image cell rows.

Figure 5:
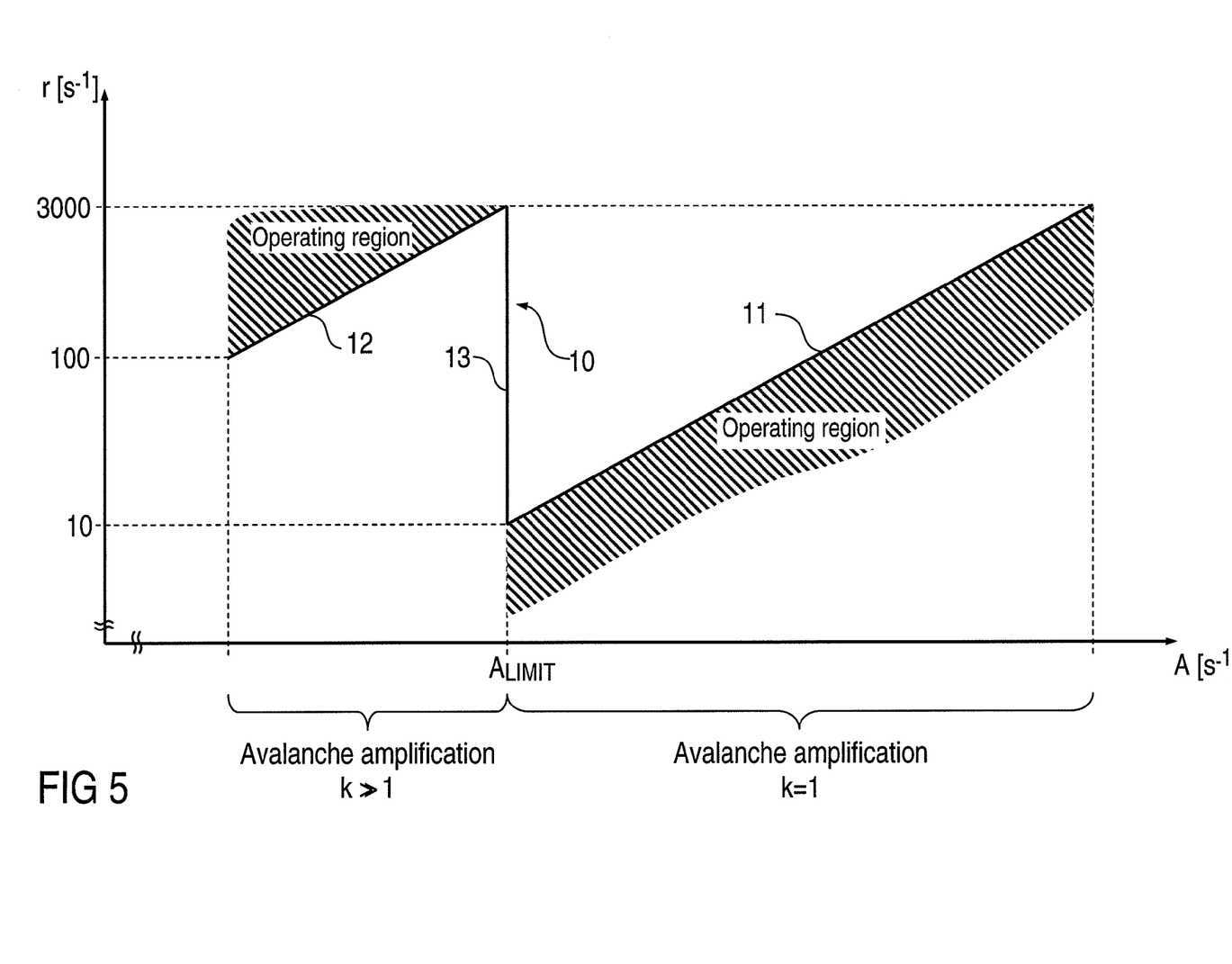
FIG. 5 shows a saw-tooth characteristic for setting the image refresh rate depending on the intensity of the radiation to be detected.

Furthermore, the radiation detector 1 according to the invention has an adjustable image refresh rate r, wherein the setting for the image refresh rate r and for the amplification factor k of the avalanche amplifier 8 is described below on the basis of FIG. 5. FIG. 5 shows a saw-tooth characteristic 10 which represents the relationship between the image refresh rate r and the intensity A of the radiation to be detected. The characteristic 10 has a rising edge 11 in the region of a large radiation intensity A and in the region of a lower radiation intensity A, it has a further rising edge 12, wherein the two edges 11, 12 are linked to one another by a vertical edge 13.

In the region of the edge 11 of the characteristic curve 10, the intensity A of the radiation to be detected is so large that the avalanche amplifiers 8 can be switched off and therefore have an amplification factor of k=1, so that no optical photons at all that could lead to undesirable crosstalk are generated in the avalanche amplifiers 8. With decreasing radiation intensity A, however, the image refresh rate r must be reduced in accordance with the shape of the edge 11 of the characteristic curve 10, in order that the integration time frames are sufficient in the individual image cells 5 of the CCD detector structure 2 in order to generate sufficient signal electrons.

If the radiation intensity A undershoots a predetermined limit value $A_{LIMIT}$, reducing the image refresh rate r is no longer adequate to generate sufficient signal electrons in the image cells 5 despite the low radiation intensity A. If the intensity $A_{LIMIT}$ is undershot, the avalanche amplifiers 8 are switched on accordingly and operate with an amplification factor k>>1, so that the image refresh rate r can be increased again. If the intensity A of the radiation to be detected decreases further, the image refresh rate r can be reduced again according to the shape of the edge 12 of the characteristic curve 10.

In this operating mode, every photon is detected. However, it is not necessary to collect a plurality of photons in an image cell 5 in order to remain above the electrical noise threshold. The image refresh rate r is selected such that the probability of collecting a plurality of photons in the same image cell 5 remains small.

The structure of the radiation detector 1 will now be described based on FIG. 2.

The radiation detector 1 has a weakly n-doped semiconductor substrate 14, wherein a p-doped rear electrode 16 is arranged on a back side 15 of the semiconductor substrate 14.

The CCD detector structure 2 is integrated onto the front side 17 of the semiconductor substrate 14, said CCD detector structure 2 being designed in this exemplary embodiment as a pn-CCD detector structure. The construction and the functionality of the CCD detector structure 2 is described, for example, by Gerhard LUTZ: "Semiconductor radiation detectors", Springer Verlag, $2^{nd}$ edition 2001, pages 137-152, so that reference is also made in this regard to this publication. At this point, it should only be mentioned that the pn-CCD detector structure has a plurality of electrodes 18-22 which transport the signal electrons generated in the individual image cells 5 of the CCD detector structure 2 in the semiconductor substrate 14 in the direction of the arrow at a depth T which lies in the range of 0.25 R to 0.5 R, wherein R is the grid spacing of the electrodes 18-22.

Figure 2:
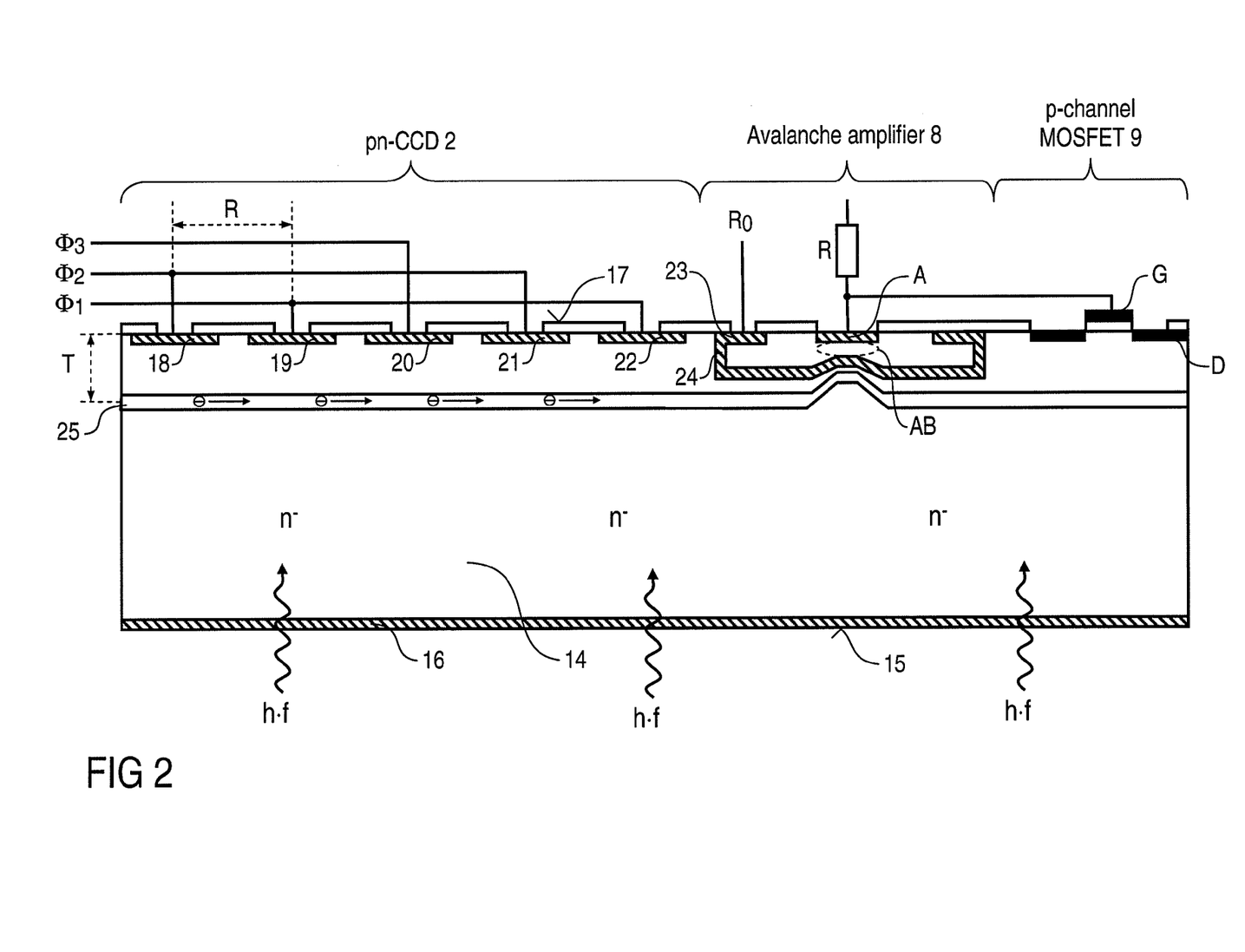
FIG. 2 shows a schematic cross section along an image cell row of the CCD detector structure according to FIG. 1, with an avalanche amplifier and a downstream p-channel MOS-FET.

The cross-sectional view in FIG. 2 also shows the structure of the avalanche amplifier 8, which has a read-out electrode A, a control electrode 23 and a buried p-doped semiconductor region 24. By means of suitable driving of the control electrode 23, an electric field which is directed approximately perpendicularly to the front side 17 of the semiconductor substrate 14 is produced in an avalanche region AB (high-field region) between the buried semiconductor region 24 and the read-out electrode A, and the signal electrons supplied by the CCD detector structure 2 are accelerated upwardly to the read-out electrode A, wherein the field can be adjusted so that avalanche amplification takes place in the avalanche amplifier 8. With regard to the operational method and structure of the avalanche amplifier 8, reference is also made to the German patent application 10 2004 022 948.1-33, which concerns an avalanche radiation detector, so that the content of this patent application is to be added to the present description.

The read-out electrode A of the avalanche amplifier 8 is connected to a gate G of the transistor amplifier 9 which in this exemplary embodiment is configured as a p-channel MOSFET and has an implanted source S and an implanted drain D. The structure and operational method of a p-channel MOSFET is described, for example, by Gerhard LUTZ: "Semiconductor radiation detectors", Springer Verlag, $2^{nd}$ edition 2001, pages 165-175, so that the content of this publication with regard to the structure and functional method of the transistor amplifier 9 is to be added to the present description.

Finally, an n-doped buried semiconductor region 25 is arranged in the semiconductor substrate 14 and this region is intended to prevent the emission of holes to the rear electrode 16. The semiconductor region 25 can simultaneously serve to conduct the signal electrons. It does not have to run through continuously, but can be interrupted or raised.

The buried semiconductor region 25 is raised beneath the avalanche amplifier 8, so that the signal electrons are focused in the avalanche region of the avalanche amplifier 8.

Figure 3:
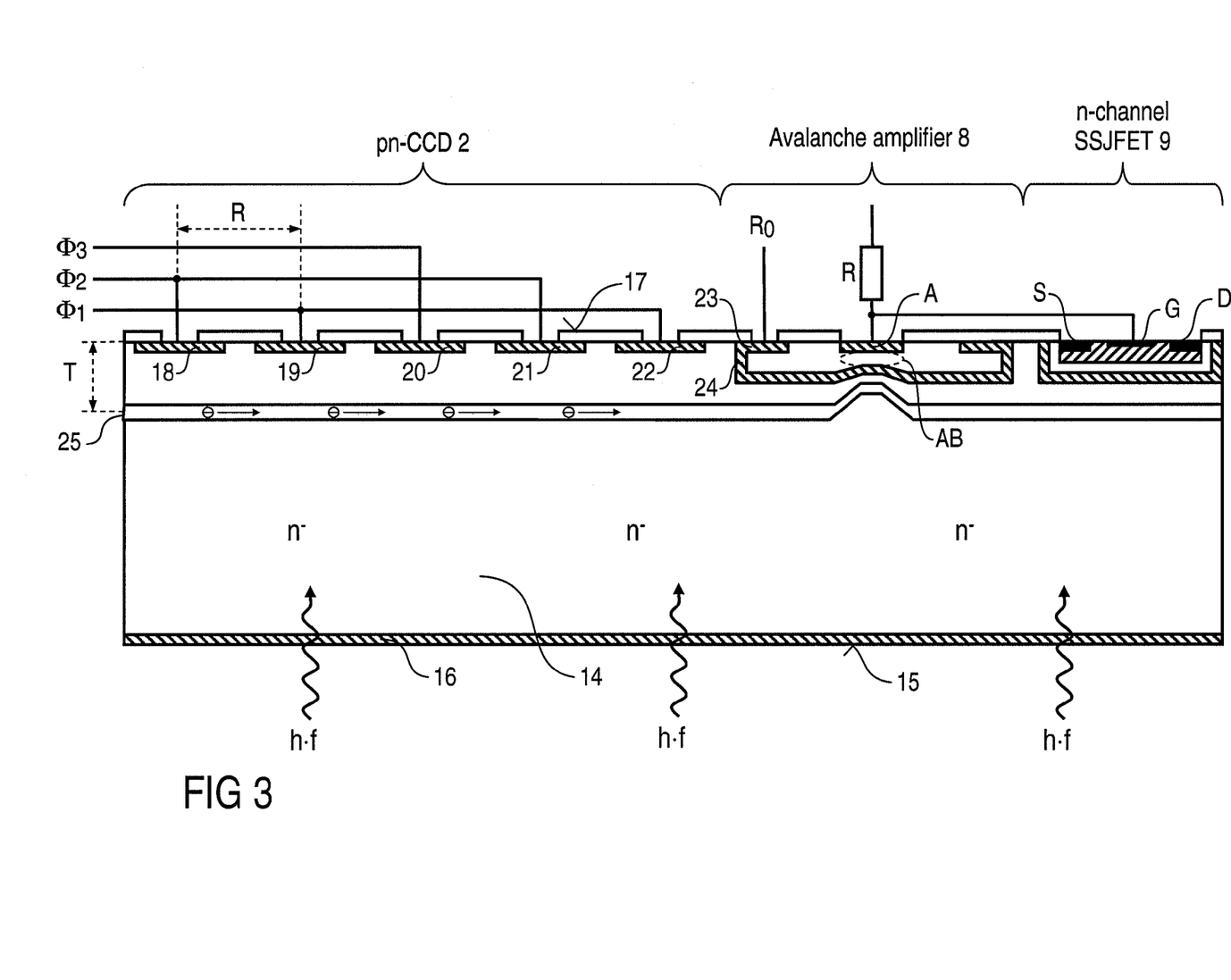
FIG. 3 shows a modification of FIG. 2 wherein an n-channel SSJFET is connected downstream of the avalanche amplifier.

FIG. 3 shows an alternative exemplary embodiment which largely corresponds to the exemplary embodiment described above and illustrated in FIG. 2, so that to avoid repetition, reference is made to the above description with regard to FIG. 2, wherein the same reference signs are used for corresponding elements.

A peculiarity of this exemplary embodiment consists therein that the transistor amplifier 9 is designed as an n-channel SSJFET (SSJFET=Single-Sided Junction Field Effect Transistor). The structure and operational method of the n-channel SSJFET is described, for example, by Gerhard LUTZ: "Semiconductor radiation detectors", Springer Verlag, $2^{nd}$ edition 2001, pages 233-238, so that the content of this publication with regard to the structure and functional method of the n-channel SSJFET is to be added in its entirety to the present description.

Figure 4:
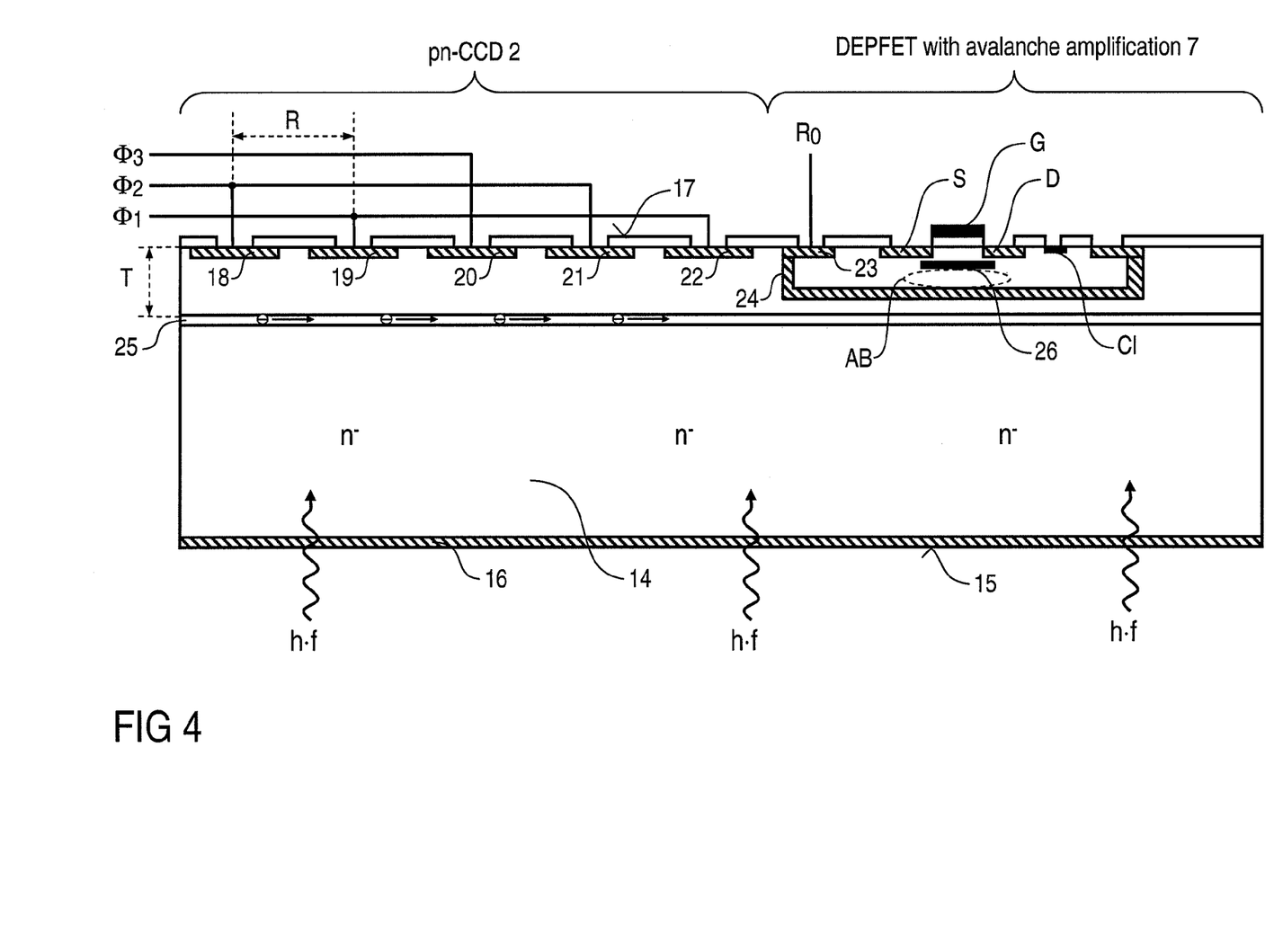
FIG. 4 shows a further modification of FIG. 2, wherein the output amplifier is a DEPFET with integrated avalanche amplification.

Finally, FIG. 4 shows a further exemplary embodiment which largely agrees with the exemplary embodiment described above and illustrated in FIG. 2 so that, to avoid repetition, reference is made to the above description, wherein the same reference signs are used for corresponding elements.

A peculiarity of this embodiment consists therein that the avalanche amplifier 8 is spatially integrated with the transistor amplifier 9, wherein the transistor amplifier 9 is designed as a DEPFET (DEPFET=Depletion Field Effect Transistor). The structure and operational method of a DEPFET of this type is described, for example, by Gerhard LUTZ: "Semiconductor radiation detectors", Springer Verlag, $2^{nd}$ edition 2001, pages 243-253, so that the content of this publication with regard to the structure and functional method of the n-channel SSJFET is to be added in its entirety to the present description. It should only be mentioned at this point that the transistor amplifier 9 designed as a DEPFET has a gate G, a source S, a drain D and a reset contact C1. Furthermore, under the gate G, the DEPFET has a buried n-doped semiconductor region 26.

The invention is not restricted to the exemplary embodiments described above. Rather, many variants and developments thereof are possible, which also make use of the inventive concept and therefore fall within the scope of protection.

REFERENCE SIGNS 1 radiation detector
2 CCD detector structure
3 output amplifier unit
4 CAMEX amplifier
5 image cells
6 signal outputs
7 output amplifiers
8 avalanche amplifiers
9 transistor amplifiers
10 characteristic curve
11, 12, 13 edges of the characteristic
14 semiconductor substrate
15 back side
16 rear electrode
17 front side
18-22 electrodes
23 control electrode
24 buried semiconductor region
25 buried semiconductor region
26 buried semiconductor region
A read-out electrode
AB avalanche region

The invention claimed is:

1. A radiation detector for detecting low-intensity radiation comprising:
    a) a CCD detector comprising a plurality of image cell rows, each of the image cell rows including a plurality of image cells arranged one behind another, and a signal output, wherein the radiation to be detected generates signal charge carriers in individual image cells and said signal charge carriers are transported along the image cell rows to a respective signal output, and
    b) a plurality of output amplifiers which are connected in parallel, each to one signal output of the individual image cell rows, and which amplify the signal charge carriers, wherein each of the output amplifiers comprises an avalanche amplifier.

2. The radiation detector according to claim 1, wherein the image cells and the avalanche amplifier are integrated together into a semiconductor substrate.

3. The radiation detector according to claim 2, wherein individual avalanche amplifiers each has an avalanche region with an electrical avalanche field which is angled relative to a surface of the semiconductor substrate.

4. The radiation detector according to claim 3, wherein the avalanche field is oriented substantially perpendicularly to the surface of the semiconductor substrate.

5. The radiation detector according to claim 3, wherein the avalanche field accelerates the signal charge carriers in the avalanche region in a direction towards the surface of the semiconductor substrate.

6. The radiation detector according to claim 3, wherein the avalanche field accelerates the signal charge carriers in the avalanche region away from the surface of the semiconductor substrate.

7. The radiation detector according to claim 1, wherein each of the output amplifiers has a transistor amplifier in addition to the avalanche amplifier.

8. The radiation detector according to claim 7, wherein the transistor amplifier comprises a field effect transistor.

9. The radiation detector according to claim 8, wherein the field effect transistor is selected from a group consisting of a MOSFET and a JFET.

10. The radiation detector according to claim 7, wherein the transistor amplifiers are connected downstream of the avalanche amplifiers.

11. The radiation detector according to claim 7, wherein the transistor amplifiers and the avalanche amplifiers of the individual output amplifiers are integrated, together with the image cells, on a semiconductor substrate.

12. The radiation detector according to claim 1, wherein each of the avalanche amplifiers has an amplification factor that sufficiently low such that no crosstalk takes place between adjacent avalanche amplifiers.

13. The radiation detector according to claim 12, wherein the amplification factor of the avalanche amplifiers is less than a maximum value selected from the group consisting of 500, 1000, 5000 and 10000.

14. The radiation detector according to claim 1, wherein the amplification factor of the output amplifiers is adjustable.

15. The radiation detector according to claim 1, wherein the image cells are a component part of the CCD detector.

16. The radiation detector according to claim 15, wherein the CCD detector is a pn-CCD detector.

17. The radiation detector according to claim 15, wherein the CCD detector is a MOSCCD detector.

18. The radiation detector according to claim 1, comprising a sensitivity sufficient for detection of individual photons.

19. The radiation detector according to claim 1, wherein the output amplifiers have an essentially linear amplification.

20. The radiation detector according to claim 1, wherein the image cells are arranged in matrix form in rows and columns.

21. The radiation detector according to claim 1, comprising an image refresh rate greater than a minimum value selected from the group consisting of 100, 500 and 1000 images per second.

22. The radiation detector according to claim 21, wherein the image refresh rate is adjustable.

23. The radiation detector according to claim 1, wherein the signal charge carriers are signal electrons.

24. The radiation detector according to claim 1, wherein the output amplifiers are connected to an evaluating unit which counts the detected photons.

25. The radiation detector according to claim 1, the avalanche amplifier being spatially separated from the image cells to avoid optical cross talk.

26. An operating method for a radiation detector, comprising the following steps:
   detection of photons in a CCD detector comprising a plurality of image cell rows, each of the image cell rows having a plurality of image cells arranged one behind another and one signal output, wherein the photons to be detected generate signal charge carriers in the image cells,
   transporting of the generated signal charge carriers along the image cell rows to the signal output, and
   amplification of the signal charge carriers appearing at the signal output,
   wherein the amplification of the signal charge carriers is carried out by avalanche amplification.

27. An operating method according to claim 26, wherein the avalanche amplification is carried out with a particular amplification factor, wherein the amplification factor is adjusted depending on the operating conditions of the radiation detector.

28. An operating method according to claim 26, wherein the detection of photons is carried out at a particular image refresh rate, wherein the image refresh rate is adjusted depending on operating conditions of the radiation detector.

29. An operating method according to claim 26, wherein the operating conditions include a photon flux of the radiation to be detected.

30. An operating method according to claim 29, wherein the image refresh rate is adjusted according to a saw-tooth characteristic depending on the photon flux.

* * * * *